United States Patent [19]

Fan et al.

[11] 4,309,225
[45] Jan. 5, 1982

[54] METHOD OF CRYSTALLIZING AMORPHOUS MATERIAL WITH A MOVING ENERGY BEAM

[75] Inventors: John C. C. Fan; Herbert J. Zieger, both of Chestnut Hill, Mass.

[73] Assignee: Massachusetts Institute of Technology, Cambridge, Mass.

[21] Appl. No.: 123,745

[22] Filed: Feb. 22, 1980

Related U.S. Application Data

[63] Continuation-in-part of Ser. No. 75,010, Sep. 13, 1979, abandoned.

[51] Int. Cl.$^3$ ............... H01L 21/263; B23K 27/00
[52] U.S. Cl. ................... 148/1.5; 136/258; 148/4; 250/492.2; 357/91; 427/53.1
[58] Field of Search ............... 148/1.5, 4, 13; 136/89 TF; 250/492 A, 398; 219/121 L; 357/91; 427/53.1

[56] References Cited

U.S. PATENT DOCUMENTS

| | | | |
|---|---|---|---|
| 2,968,723 | 1/1961 | Steigerwald | 148/4 |
| 3,585,088 | 6/1971 | Schwuttke et al. | 148/174 |
| 4,045,674 | 8/1977 | Vermeulen | 250/370 |
| 4,059,461 | 11/1977 | Fan et al. | 148/1.5 |
| 4,087,695 | 5/1978 | Lee et al. | 250/492 B |
| 4,147,563 | 4/1979 | Narayan et al. | 148/1.5 |
| 4,155,779 | 5/1979 | Auston et al. | 148/1.5 |
| 4,187,126 | 2/1980 | Radd et al. | 148/1.5 |
| 4,203,781 | 5/1980 | Miller | 148/1.5 |
| 4,229,232 | 10/1980 | Kirkpatrick | 148/1.5 |
| 4,234,358 | 11/1980 | Celler et al. | 148/1.5 |

OTHER PUBLICATIONS

Gat et al., Appl. Phys. Letts. 33 (1978) 389, 775.
Wang et al., Appl. Phys. Letts. 33 (1978) 455.
White et al., Appl. Phys. Letts. 33 (1978) 662.
Young et al., Appl. Phys. Letts. 32 (1978) 139.
Bomke et al., Appl. Phys. Letts. 33 (1978) 955.
Cohen et al., Appl. Phys. Letts. 33 (1978) 751.
Narayan et al., Appl. Phys. Letts. 34 (1979) 312.
Maserjian, J. Solid Stat. Electronics, 6 (1963) 477.
Laff, IEEE-Trans. Electron Devices, Ed.-21 (1974) 743.
Fan et al., Proc. Nat. Workshop on Low Cost Si Solar Cells, ed., Chu et al., S.M.U. Dallas, 1976.
Fan et al., in Proc. 7th Int. Symp. on GaAs (p. 89), St. Louis 1978, Inst. Phys. Conf. #45 (1979) 472.
Celler et al., Jour. Appl. Phys. 32 (8) (1978) 464.
Von Gutfeld, R. J., IBM-Tech. Disl. Bull, 19 (1977) 3955.
Kirkpatrick et al., IEEE-Trans. Electron Devices, Ed-.-24 (1977) 429.
Fang et al., IBM-TDB, 22 (1979) 1236.
Campisano et al., Solid St. Electronics, 21 (1978) 485.
Lav et al. Appl. Phys. Letts. 32(2) (1978) 130.
Fan et al., Proc. Nat. Workshop on Low Cost Poly--Crystalline Si Solar Cells, Dallas, 1976, NSF, Paper #5A.
Blum et al., J. Non-Cryst. Solids, 22 (1976) 29.
Chen et al., J. Appl. Phys. 40 (1969) 4214.
Fan et al., J. Electrochem. Soc., 122 (1975) 1719.

*Primary Examiner*—Upendra Roy
*Attorney, Agent, or Firm*—Arthur A. Smith, Jr.; David E. Brook

[57] ABSTRACT

An improved method for crystallizing amorphous material with a moving beam of energy is disclosed. In this method, the energy beam is scanned in a manner to provide controlled, continuous motion of the crystallization front.

34 Claims, 19 Drawing Figures

METHOD OF CRYSTALLIZING AMORPHOUS MATERIAL WITH A MOVING ENERGY BEAM

GOVERNMENT SUPPORT

This invention was partially supported by funds from the United States Air Force.

RELATED APPLICATION

This is a continuation-in-part of Ser. No. 75,010, filed Sept. 13, 1979, now abandoned.

TECHNICAL FIELD

This invention is in the field of materials, and more specifically relates to the conversion of amorphous materials, including amorphous semiconductor films, to crystalline materials.

Background Art

It has long been recognized that the efficiency of photovoltaic cells is lowered when the semiconductor material contains a high density of grain boundaries, which are present in polycrystalline semiconductors with small grains. Thus, the attainment of high cell efficiencies is dependent on the use of crystalline semiconductor materials which eliminate all or many of these grain boundaries, such as single crystal materials or polycrystalline materials which have large, preferentially aligned crystallines. On the other hand, the production of single crystal or large-grain polycrystalline semiconductor materials has heretofore been inordinately expensive, which has detracted from the economic competitiveness of energy produced from photovoltaic cells compared with energy from other sources, such as fossil fuel generated energy.

Because of this, much research has been directed to forming semiconductor films in an amorphous state and subsequently converting these amorphous materials to a crystalline state by rapid, inexpensive techniques. Many of these techniques have involved scanning amorphous semiconductors with a high power beam of energy, such as an electron beam or laser beam. Generally, such high power beams of energy cause localized heating and melting on the semiconductor material with subsequent cooling and crystallization as the beam advances.

An example of the use of a focused beam of electrons to recrystallize small areas on the surface layer of materials is described by Steigerwald in U.S. Pat. No. 2,968,723. In a more specific application of an electron beam, Maserjian describes the production of single-crystal germanium films on sapphire substrates by heating the substrates to an elevated temperature and subsequently employing the electron beam to melt a small zone of polycrystalline germanium film thereon which forms single crystal germanium upon cooling. The substrate is heated to minimize the energy required by the electron beam which scans at a maximum frequency of 7 cm/sec. This process is stated by the author to be analogous to zone melting of semiconductor material. See Maserjian, J., "Single-Crystal Germanium Films By Micro-Zone Melting", *Solid State Electronics,* 6, Pergammon Press, 1963, pp. 477-84.

A two-step process and technique employing transient laser heating and melting to produce isolated regions of larger-grain polycrystalline silicon in films of fine-grain silicon on substrates such as fused silica has been described by Laff et al. See Laff, R. A. and Hutchins, G. L., *IEEE Transactions On Electron Devices,* Vol. ED-21, No. 11, Nov. 1974, p. 743. Because of certain disadvantages of such a laser-melting technique, others have employed radiant heating from a hot filament ribbon to give efficient thermal coupling to an amorphous silicon film in place of laser heating. See Von Gutfeld, "Crystallization of Silicon For Solar Cell Application", *IBM Technical Disclosure Bulletin,* 19, No. 10, March, 1977, pp. 3955-6.

Another method for improving the crystallinity of semiconductor materials by scanning them with a focused laser beam from a high-power laser suitably matched to the optical absorption properties of the semiconductor has previously been disclosed in our prior U.S. Pat. No. 4,059,461, issued on Nov. 22, 1977. An example of the use of our patented method involves the use of a focused beam from a Nd:YAG laser which is scanned across an amorphous silicon film at a rate sufficient to allow the film to heat to a temperature at which crystallization occurs. The Nd:YAG laser has been found to be particularly desirable with silicon films because of its relatively high overall power efficiency, its high power output, and because it is well matched to the absorption characteristics of an amorphous silicon film since radiation is absorbed substantially uniformly across a thickness of about 10 $\mu$m. Large silicon crystallites are obtained after scanning, and it is even possible by out method to use a shaped laser spot, such as a slit, to provide a preferred crystalline orientation within the film. Of course, other semiconductors and other lasers can be used in our method, as long as the laser wavelength and semiconductor are suitably matched and as long as the laser beam provides sufficient energy to improve the crystalline properties of the scanned film. It is particularly noteworthy that our method does not require that the semiconductor material be heated to a temperature above the melting point of the crystalline material to achieve crystallization. It is in fact preferred to carry this method out completely as a solid phase transformation.

Although our patented method has proven to be satisfactory for the crystallization of many semiconductor films, further experimentation did produce some unusual phenomena in certain cases. These included the formation of periodic structural features on semiconductor film surfaces, pulsations of film temperature during scanning, and runaway crystallization of an entire film following first contact with a laser image. Such phenomena were initially not well understood.

DISCLOSURE OF THE INVENTION

The invention described herein arises out of our further investigation into the unusual phenomena which sometimes occur with the laser crystallization techniques disclosed in U.S. Pat. No. 4,059,461. These further investigations include the generation of a theoretical model which can be used to predict the unusual phenomena previously observed with some film crystallizations. Because of such investigations, we have now discovered how to provide continuous, controlled motion of the crystallization front in an amorphous material by controlling parameters such as the rate at which the laser beam or other beam of energy is moved across an amorphous material and the temperature of the substrate.

In the most general sense, our invention comprises the improvement in converting amorphous material to a more crystalline state by moving an energy beam across the material under conditions which provide continuous, controlled motion of the crystallization front. One aspect of controlling the crystallization front relates to the scanning rate of the energy beam, which in the case of this invention is typically higher for most materials than scan rates previously employed with the same materials. The crystallization efficiency of these increased scan rates is surprising particularly in view of those prior art teachings in which the beam energy was employed to heat local areas of an amorphous or polycrystalline material to a molten state. Unlike crystallizations achieved by heating the material to a temperature above the melting point of the crystalline material, the crystallizations achieved by this invention are done in the solid phase. Such solid phase transformations allow lower temperatures to be employed, are extremely rapid, and result in crystallized materials having exceptionally smooth surfaces.

Another aspect of controlling the crystallization front relates to modulation of the energy beam, and in particular, spatial and/or temporal modulation of the beam intensity. In general, any modulation is sufficient that provides a crystallization front which advances fast enough to avoid quenching and periodic structure while also avoiding crystallization front runaway.

Thus, this invention offers many advantages over prior techniques for crystallizing amorphous materials, and in general, permits the rapid, uniform, solid-phase conversion of a wide variety of amorphous material to a more crystalline state.

BEST MODE OF CARRYING OUT THE INVENTION

The invention will now be further described with particular reference to the Figures.

Figures 1, 7:
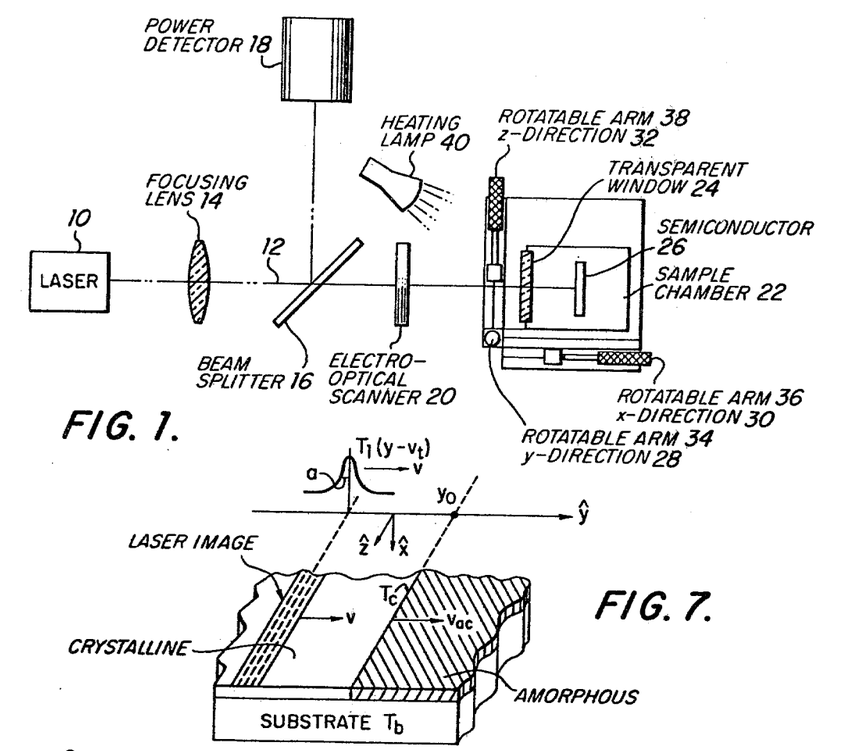
FIG. 1 is a schematic view of an apparatus suitable for scanning amorphous material with a laser beam as described herein.
FIG. 7 is a schematic diagram illustrating the crystallization of an amorphous semiconductor film by a scanned slit laser image.

An apparatus suitable for scanning semiconductor films with a focused laser beam is illustrated in FIG. 1. Laser 10, which is a high power, high efficiency laser, such as a Nd:YAG laser, emits laser beam 12 which is focused to a spot having the shape and size desired by focusing lens 14. A preferred shape is one which has a large aspect ratio, such as an elongated slit, because such shapes can be used to align semiconductor crystallites as well as to enlarge them. This is apparently because the slit produces thermal gradients in the semiconductor film transverse to its long axis. Because of these temperature gradients, crystallization of the film results in a preferred alignment and growing, aligned domains then tend to coalesce as the scanning continues producing larger, more aligned grains.

The exact size and shape of the focused laser spot will depend upon factors such as laser power, scanning rate, area to be scanned, crystalline properties desired, etc. Various shapes are obtainable by employing beam expanders, cylindrical lenses, mirrors, or other optical or mechanical elements known to those skilled in the art. For reasons of practicality, it is preferred to use a spot size having an area of at least about $10^{-4}$ cm$^2$. It is also particularly preferred, as mentioned above, to employ a laser image having a large aspect ratio. For example, if the beam is rectangular in shape, it is preferred to have the aspect ratio (l/w) greater than 10. Large aspect ratios provide uniform temperature gradients which, in turn, promote aligned crystallites.

Beam splitter 16 is used to divide focused beam 12 so that a first portion is reflected to power detector 18 and a second portion is transmitted to electro-optical scanner 20. Power detector 18 serves to measure the exact beam power so that any desired changes in laser power, scanning rate, etc., can be made. Electro-optical scanner 20 is one convenient means for scanning focused beam 12. After passing scanner 20, focused beam 12 enters sample chamber 22 through transparent window 24 and strikes the surface of semiconductor 26.

Scanning of semiconductor 26 can be achieved by mounting sample chamber 22 upon three translational stages, 28, 30 and 32. Translational stages 28, 30 and 32 provide the capability to move chamber 22, and thus semiconductor 26, in the x, y and z directions, respectively. Each stage can be independently driven by connecting rotatable arms 34, 36 and 38 to electric motors (not shown). Each stage can be driven separately, or any combination can be driven simultaneously. Also, the rate at which each stage can be driven is variable. Thus, a great variety of scan patterns and rates is achievable.

Of course, electro-optic or acousto-optical beam deflectors or other means to raster the laser beam can also be used, and these are known to those skilled in the art. In fact, scanning can be achieved by moving either the sample or the beam, or both.

The scan rate is set, of course, by the dwell time required. As a general rule, however, the scan rates used with this invention are higher than those used with prior methods.

Radiant heating lamp 40 can be used to help heat the semiconductor 26. Induction heaters, resistance heaters, or other means to heat semiconductor 26 could, of course, also be employed.

The apparatus illustrated in FIG. 1 is typical of that employed in our previous patent, U.S. Pat. No. 4,059,461. The teachings of our prior patent are hereby incorporated by reference, particularly in regard to other suitable apparatus for carrying out a laser-crystallization process and for matching the characteristics of the laser to the amorphous material to be scanned as well as the determination of other appropriate parameters for the method.

To investigate some of the unusual phenomena sometimes observed in laser crystallizations, a crystallization system utilizing a cw Nd:YAG laser beam focused to a slit image with power density that is uniform to ±3% over a central area about 50 $\mu$m by 1.5 mm was employed. The samples were placed in an Ar/$H_2$ atmosphere on a resistively-heated platform that permitted them to be scanned at various rates obtained by using synchronous motors, under the laser beam in the focal plane and normal to the long axis of the slit image. This apparatus is described in more detail in the following references, the teachings of which are hereby incorporated by reference: J. C. C. Fan, H. J. Zeiger, and P. M. Zavracky, Proc. Nat. Workshop on Low Cost Polychrystalline Silicon Solar Cells, Dallas, 1976, edited by T. L. Chu and S. S. Chu (Southern Methodist University, Dallas, 1976), p. 89; and J. C. C. Fan, J. P. Donnelly, C. O. Bozler, and R. L. Chapman, Proc. 7th Int. Symp. on GaAs and Related Compounds, St. Louis, 1978, Institute of Phys. Conf. Ser. No. 45, Chapter 6, p. 472 (1979). Amorphous germanium (a-Ge) films were deposited by either electron-beam evaporation, rf sputtering, or ion-beam sputtering on molybdenum, graphite, or fused-silica substrates.

In initial experiments on a-Ge films 2–4 micrometers thick on molybdenum and graphite substrates, the platform was heated to maintain the temperature of the film before laser irradiation ($T_b$) at 400°–500° C. Once crystallization was initiated by momentary irradiation at a single point, the transformation was found to be self-sustaining, with the crystallization front rapidly propagating radially outward from the irradiated spot. Films as large as 2.5 cm × 2.5 cm were entirely crystallized in this manner. At lower values of $T_b$ self-sustaining crystallization did not occur, but laser scanning yielded areas of elongated, well-aligned grains. The surface of the scanned films remained smooth, regardless of $T_b$. The maximum temperature reached by the film during scanning, estimated from its color, was about 700° C., far below the melting point of crystalline Ge, which is about 937° C. Because of this, the transformations from amorphous to crystalline described herein are referred to as "solid phase transformations". This means that the maximum temperature reached by the material as a result of the energy beam is below the melting point of the crystalline phase of the material.

Figure 2:
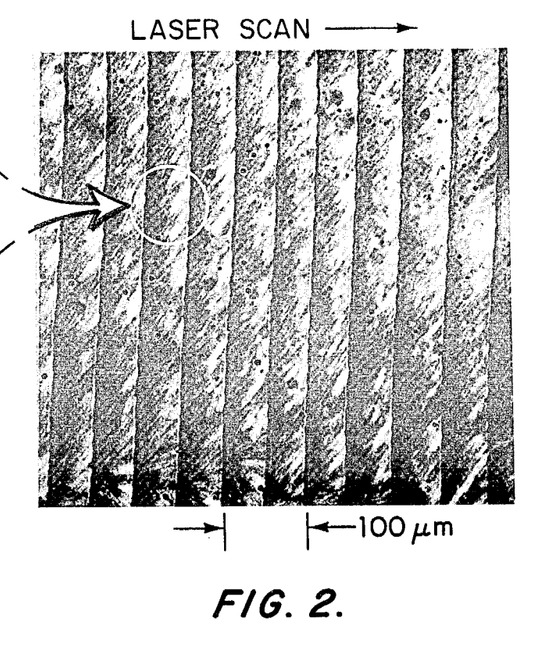
FIG. 2 is an optical transmission micrograph of a laser-crystallized germanium film having periodic structural features.
Figure 3:
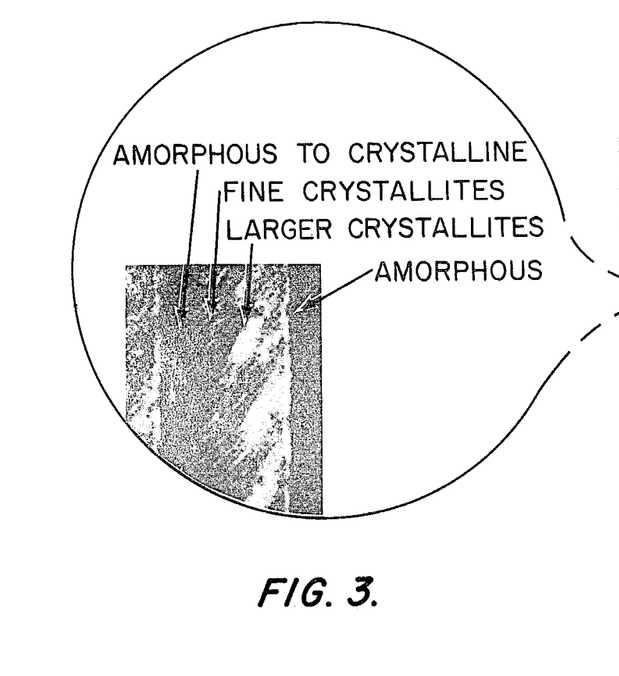
FIG. 3 is an exploded view of a small area of the micrograph of FIG. 2.

A series of laser scanning experiments on films about 0.3 $\mu$m thick deposited by electron-beam evaporation on 1-mm thick fused silica substrates was then performed. The power density of the central area of the laser image was kept at about 5 kW/cm$^2$, and the scan rate at 0.5 cm/sec. The background temperature $T_b$, which was found to be critical in crystallization behavior, was varied from room temperature to 500° C. For $T_b$ equal to room temperature, after laser scanning, the films exhibited periodic structural features. Within each film the spatial period initially increased, but after several periods, it reached a steady-state value of about 50 $\mu$m. FIG. 2 shows an optical transmission micrograph of one such film, obtained with visible radiation from a xenon lamp. The dark areas in the micrograph are regions of untransformed a-Ge, which for the film thickness used was almost opaque to visible and near-infrared radiation, while the bright areas are regions of crystalline Ge, which had significant transmission in the red and near-infrared. Similar contrast was also obtained using infrared microscopy. Each periodic feature consisted of four different regions, as shown in FIG. 3. These were a narrow amorphous region, followed by another region containing a mixture of amorphous material and fine grains, and then a broad region of fine crystallites, and finally another broad region of much larger, elongated crystallites having dimensions of about 1-2 × 20 micrometers, generally aligned parallel to each other but at an angle of about 55° to the laser scan direction. In the films examined in detail, it was noted that the large crystallites within each periodic feature formed a roughly chevron-like pattern, with the two halves of the pattern symmetrical about an axis parallel to the scan direction and located near the center of the laser slit image. Thus, the angles between the long axes of the crystallites and the scan direction were similar in magnitude but of opposite sense for the two halves of the pattern. In the micrograph of FIG. 2, the symmetry axis lies close to or just below the bottom of the micrograph, so that only half the chevron pattern can be seen.

Figure 4:
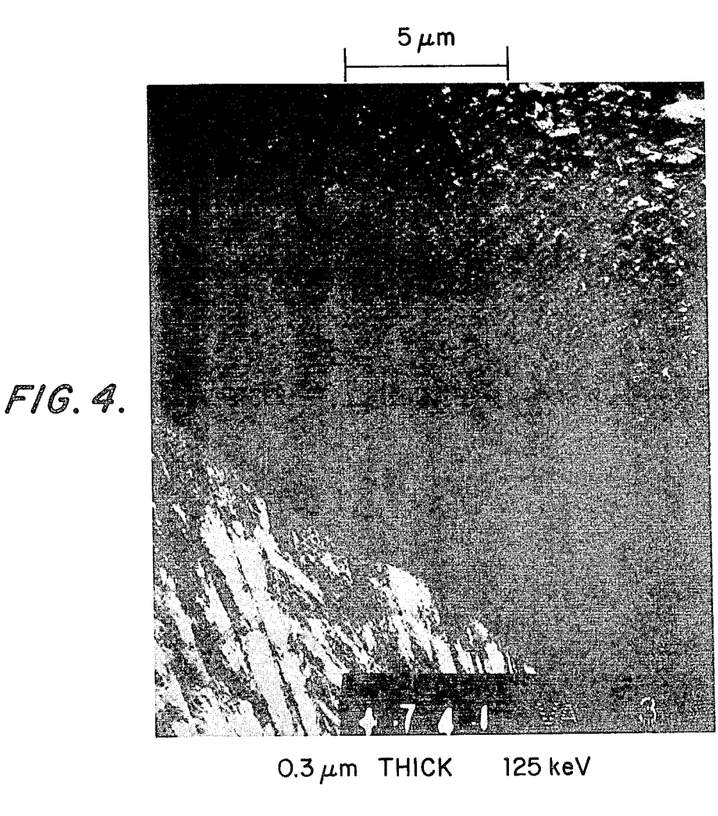
FIG. 4 is a bright-field transmission electron micrograph of a laser-crystallized germanium film.
Figure 5:
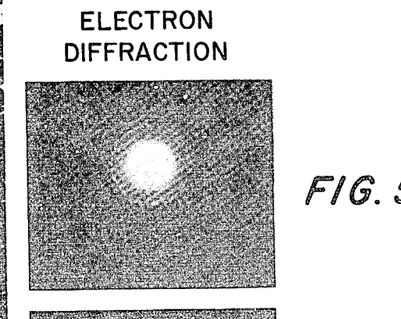
FIGS. 5 and 6 are transmission electron diffraction patterns for fine-grained and large-grained regions of a laser-crystallized germanium film.
Figure 6:
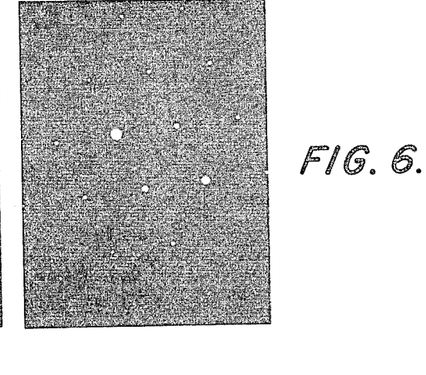

The optical microscopy results were confirmed by transmission electron microscopy (TEM) using 125 keV electrons. The TEM samples were removed from their substrates using hydrofluoric acid to partially dissolve the fused silica. FIG. 4 is a TEM bright-field micrograph of a portion of a film that was laser-scanned with $T_b$ equal to room temperature. The micrograph illustrates the same sequence of regions found by optical microscopy and shown in FIG. 2: amorphous (the dark area), amorphous-plus-crystalline, fine-grain and large-grain. The fine-grain region yields a transmission electron diffraction pattern like the one shown in FIG. 5, with the rings typical of polycrystalline material. Within this region, the grain size gradually increases until it reaches about 0.3 $\mu$m, the thickness of the film, then increases abruptly to give the large, well-aligned crystallites of the final region, which are clearly visible as ribbon-like structures in the lower left corner of the micrograph of FIG. 4. This is the end portion of the preceeding periodic feature. It has been demonstrated by bright-field and dark-field TEM that each of these structures is a single grain, and that they yield characteristic single-crystal transmission electron diffraction patterns. FIG. 6 is an example of such a diffraction pattern. This pattern indicates that the crystallites are oriented with the normal to the plane of the substrate in a $<110>$ direction, their long axis in a $<001>$ direction, and a $<112>$ direction parallel to the long axis of the laser slit image. These orientations are clearly characteristic of the solidphase growth process described herein. Since they are the same for the large crystallites throughout the film, even though these crystallites in successive periodic features are separated by regions of amorphous and randomly oriented, fine-grain material. The above experiments were repeated using values of background temperature $T_b$ that were above room temperature but not high enough to result in self-sustaining crystallization, and the resulting scanned films exhibited periodic structural features similar to those described above.

In an effort to explain the periodic structural features formed as a result of laser scanning, the dependence of the spatial period on $T_b$, and the occurrence of self-sustaining crystallization at values of $T_b$ greater than the runaway temperature $T_r$, a theoretical model for the dynamics of the scanned laser crystallization of an amorphous film was developed. Although the following discussion is set forth in terms of a specific system, i.e., laser scanning an amorphous semiconductor film, it should be recognized that the mathematical model produced applies very generally to other systems, and specifically to moving energy beams other than lasers and amorphous materials other than semiconductor films.

FIG. 7 is a schematic diagram illustrating the geometry considered. The film is deposited on a thick substrate that is heated to $T_b$, and the laser image is scanned from left to right at velocity v. The approximation was made that the amorphous-crystalline (a-c) transformation occurs instantaneously when the film reaches a critical temperature $T_c$. The basis for this approximation is that the rate of transformation increases exponentially with temperature. See Blum, N. A. and Feldman, C., *J. Non-Cryst. Solids,* 22, 29 (1976). This means that over a narrow temperature interval the ratio of the time required for transformation to the time required for laser scan changes from $>>1$ to $<<1$. The a-c boundary therefore coincides with a $T_c$ isotherm, and the motion of the boundary can be found by calculating the motion of the isotherm.

Crystallization of the amorphous film, accompanied by liberation of latent heat, begins when the film temperature reaches $T_c$ along a line at the left edge of the film that is parallel to the long axis of the laser image. Because the film temperature ahead of the image is then increased by conduction of the latent heat as well as by laser heating, the $T_c$ isotherm, and therefore the a-c boundary, move to the right at a velocity $v_{ac}$ that is initially much higher than v. As the boundary moves away from the laser image, the contribution of laser heating to the temperature at the boundary decreases rapidly. The continuing liberation of latent heat tends to maintain the forward motion of the boundary, but if $T_b$ is less than $T_r$, heat conduction within the film eventually reduces the boundary temperature below $T_c$, and the boundary abruptly stops moving. At this time, there is a region of crystallized material between the laser image and the left edge of the untransformed film. The boundary then remains at rest until its temperature is increased to $T_c$ by the approaching laser image, and the whole process is repeated. Thus, although the laser image is scanned at a constant velocity, the a-c boundary moves in a series of rapid jumps between rest positions. According to the model, the periodic structural features of the laser-scanned film are due to this periodic motion of the boundary, and the spatial period of these features is the distance between successive rest positions. With increasing $T_b$, this distance increases, since less heat is required to increase the film temperature to $T_c$, so that the a-c boundary moves farther beyond the laser image before it comes to rest. If $T_b$ exceeds $T_r$, the continuing release of latent heat is sufficient to maintain the propagation of the $T_c$ isotherm indefinitely, resulting in self-sustaining crystallization. Such self-sustaining crystallization does not result in large, aligned crystallites.

The actual derivation of the theoretical model will now be given.

The semiconductor film, which is deposited on a thick substrate of poor thermal conductivity, is of infinite extent in the y and z directions and so thin that its temperature is constant in the x direction. The laser slit image is of infinite length in the z direction and moves at a velocity v from left to right in the y direction. At $t=0$, the phase boundary is located at $y_o$, with the crystalline phase to the left ($y<y_o$) and the untransformed amorphous phase to the right ($y>y_o$). The laser image carries with it a steady temperature profile $T_1$ (y-vt). At $t=0$, the temperature at the phase boundary reaches $T_c$ and the boundary begins to move toward the right, with heat being liberated at a rate per boundary unit cross-sectional area of $fL\rho\dot{Y}(t)$, where L is the latent heat of a-c transformation of the semiconductor, $\rho$ is the semiconductor density, Y(t) is the position of the boundary at time t, and f is a factor less than 1 that accounts in an approximate way for the loss of latent heat to the substrate. Then the temperature T(y,t) at any point y along the film at time t is given by the one-dimensional integral relation $$T(y,t) = T_1(y - vt) + \frac{fL}{C} \frac{1}{2(\pi\kappa)^{\frac{1}{2}}} \int_0^t \frac{\dot{Y}(t')}{(t-t')^{\frac{1}{2}}} \exp\left(-\frac{[y - Y(t')]^2}{4\kappa(t-t')}\right) dt' \quad (1)$$

where C is the specific heat of the film, $\kappa = K/C\rho$ defines its thermal diffusivity, and K is its thermal conductivity. An integral equation for Y(t) can be obtained by using the condition that the temperature at the phase boundary is $T_c$ or $$T[Y(t),t] = T_c \quad (2)$$

For purposes of calculation, it is convenient to rewrite Eq. (2) in the frame of reference moving with the laser image. For this purpose, the position variable $u(t) = y(t) - vt$ is introduced, where u(t) is measured from the center of the laser image as origin. The temperature $T_1$ is modeled in the form $T_1(u) = T_b + \Delta T_l \exp[-(u/a^2)]$, where $T_b$ is a uniform, time-independent background temperature and the temperature contribution due to the laser is described by a Gaussian of width a and magnitude $\Delta T_l$. Finally, introducing normalized quantities, the integral equation for the motion of the phase boundary can be written as $$1 = \alpha \exp\{-[S(\tau)]^2\} + \eta \int_0^\tau \{[S(\tau') + V]/(\tau-\tau')^{\frac{1}{2}}\} \exp\{-[S(\tau) - S(\tau') + V(\tau-\tau')]^2/(\tau-\tau')\} d\tau' \quad (3)$$

where $$\alpha = \Delta T_l/(T_c - T_b) \quad (4a)$$

$$\eta = fL/C\pi^{\frac{1}{2}}(T_c - T_b) \quad (4b)$$

$\tau \equiv 4\kappa t/a^2$, $V \equiv av/4\kappa$, $S \equiv U/a$,
$S(\tau') \equiv [dS(\tau')/d\tau'] = (1/a)[dU(\tau')/dt']dt'/d\tau'$, and
U is the position of the phase boundary measured from the center of the laser image.

Equation (3) is not in itself sufficient to give physically acceptable solutions for the motion of the phase boundary, since it allows negative values of $[S(\gamma') + V]$, which imply a motion of the phase boundary back toward the laser image, with the reconversion of crystalline material to the amorphous state, accompanied by the reabsorption of latent heat. To constrain Eq. (3) to physically acceptable solutions it is required that, when the numerical solution of Eq. (3) yields $[\dot{S}(\tau') + V] \leq 0$, this quantity is to be set equal to zero, with the phase boundary remaining stationary.

Figure 8:
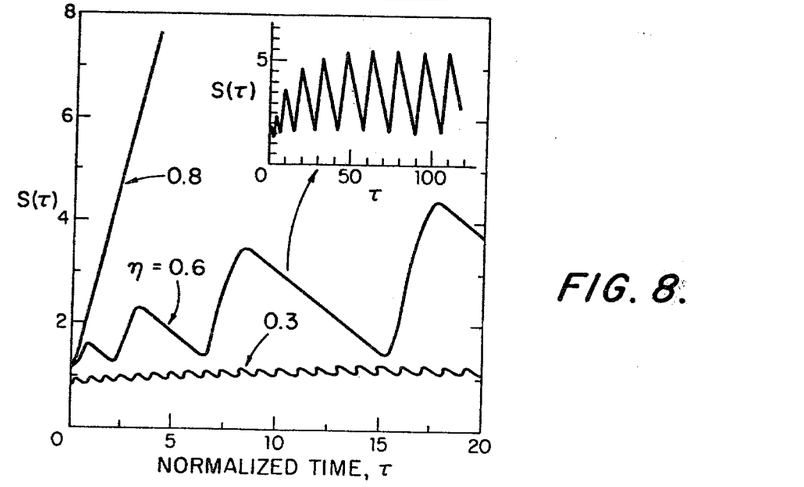
FIG. 8 is a plot of normalized position of amorphous-crystalline phase boundary with respect to a laser image as a function of normalized time obtained from the theoretical model for various given parameters.

Equation (3) has been solved numerically to obtain S as a function of $\tau$ for representative values of $\alpha$, $\eta$, and V, with the boundary conditions that $S(\tau) = 0$ t $\tau = 0$ and that $S(0)$ is given by $1 = \alpha \exp\{-[S(0)^2]\}$. The inset of FIG. 8 calculated for $\alpha = 3.6$, $\eta = 0.6$, and $V = 0.3$, depicts the approach to the steady state oscillatory type of solution characteristic of Eq. (3). FIG. 8 shows plots of S vs $\tau$ for $V = 0.3$ and three increasing values of $\eta$, with $\alpha$ increasing in proportion to $\eta$ (which corresponds, from Eqs. (4a) and (4b), to increasing $T_b$ toward $T_c$ while holding $\Delta T_l$ fixed). For each value of $\eta$, S initially increases rapidly because the latent heat liberated by the phase transformation raises the temperature ahead of the boundary, accelerating its forward motion. As the boundary moves away from the laser image, the contribution of the laser to the temperature ahead of the boundary decreases rapidly. For $\eta = 0.3$ the boundary motion soon decelerates, and the boundary comes to rest, remaining fixed for a time interval during which its temperature initially drops rapidly below $T_c$ and S decreases with velocity $\dot{S} = -V$. With the approach of the laser image, the boundary temperature gradually increases to $T_c$, the boundary once more moves forward, and S again increases. This cycle is repeated indefinitely, resulting in the oscillations in S seen for $\eta = 0.3$ in FIG. 8.

When $\eta$ is increased by increasing $T_b$, less latent heat is required to heat the film to $T_c$ ahead of the laser image, and the phase boundary moves farther beyond the laser before it decelerates and comes to rest. This trend is illustrated by the calculated curve for $\eta = 0.6$ in FIG. 8, and leads to periodic motion with a longer period. When $\eta$ becomes large enough, the heat liberated during crystallization is sufficient to sustain the transformation, causing the boundary to "run away" from the laser image. This situation, which is illustrated by the curve for $\eta = 0.8$ in FIG. 8, accounts for the observation that the entire film is crystallized following momentary contact with the laser image.

For the three curves shown in FIG. 8, the average value of $\dot{S}(\tau)$ during each of the times when the phase boundary is moving ahead of the laser image is seen to be approximately the same and essentially independent of $\eta$.

In addition to explaining runaway crystallization, the proposed model can also explain other qualitative observations on laser crystallization. For example, different regions of such films can be expected to differ in microstructure depending on their rates of transformation and therefore on their thermal history. This suggests that the periodic structural features observed on laser-crystallized films, such as that seen in FIG. 2, can be attributed to oscillations in S like those implied by the curves for $\eta = 0.3$ and 0.6 in FIG. 8. Furthermore, for sufficiently high values of $\eta$ these oscillations produce large fluctuations in the rate of heat liberation and therefore in temperature. This can explain the periodic fluctuations in color temperature observed during some laser crystallization experiments.

In order to carry out a semi-quantitative test of the model, the spatial period of the structural features of laser-crystallized Ge films was determined as a function of $T_b$. Experiments were performed on amorphous films 0.3 μm thick, deposited on fused silica substrates and scanned at $v = 0.5$ cm/sec with the slit image of a cw Nd:YAG laser. Initially, a film at room temperature was irradiated at a laser power level just high enough to produce crystallization, which yielded structure in the transformed film with a spatial period of $\sim 50$ μm. In the following experiments each film was heated to a successively higher value of $T_b$, the laser scanned at the same power level, and the spacing measured after crystallization. This procedure was continued until $T_b$ approached the value resulting in runaway.

To use the model to calculate the spatial period in the film, it was assumed that this period was equal to the distance $\Delta Y$ traversed by the a-c phase boundary during each of its successive jumps, from the point where crystallization is initiated by the approaching laser to the point where the boundary comes to rest ahead of the laser. This distance is just equal to $(aV\Delta\tau)$, where V is the normalized laser scanning velocity and $\Delta\tau$ is the normalized time interval between the beginnings of two successive jumps, i.e., the period of the oscillations in S illustrated by the curves for $\eta = 0.3$ and 0.6 in FIG. 8.

Figure 9:
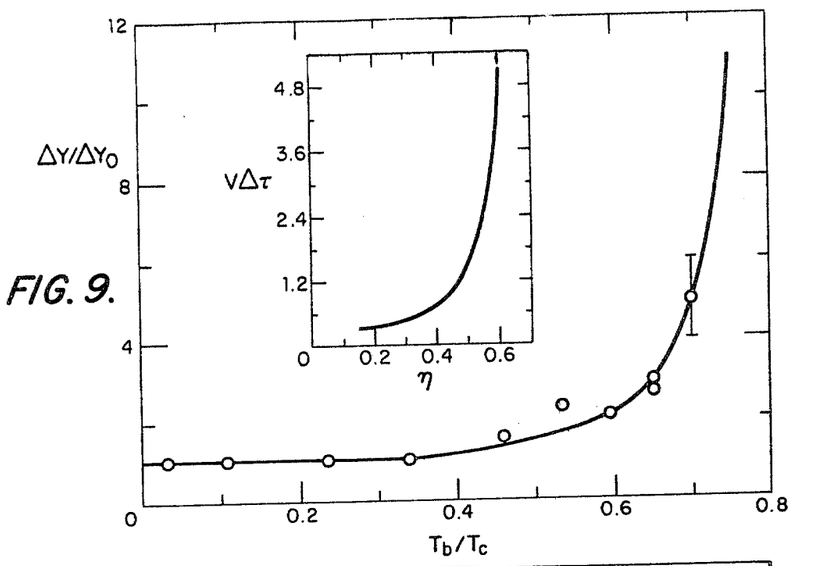
FIG. 9 is a plot of theoretical and experimental data for spatial periodicity ratio vs. temperature ratio for laser-crystallization of a germanium film.

To obtain a relationship between $\Delta Y$ and $T_b$, Eq. (3) was first used to calculate $V\Delta\tau$ as a function of $\eta$ for representative values of $\alpha$ and V. The calculated curve for $\alpha = 6\eta$ (corresponding to fixed $\Delta T_l$) and $V = 0.3$ is shown in the inset of FIG. 9. With increasing $\eta$, $\Delta\tau$ and therefore $V\Delta\tau$ increase rapidly, leading to boundary runaway by $\eta = 0.65$. For a given value of $\eta$, $V\Delta\tau$ was found to be quite insensitive to either $\alpha$ or V, showing that the boundary jump distance is determined primarily by the properties of the film and by $T_b$, and does not depend strongly on either the power or velocity of the laser.

In order to compare theory with experiment, the curve of $V\Delta\tau$ vs $\eta$ shown in the inset of FIG. 9 was used to obtain curves relating the ratios $\Delta Y/\Delta Y_o$ and $T_b/T_c$, where $\Delta Y_o$ is the spatial period in the film (i.e., the boundary jump distance) for $T_b$ of room temperature. To calculate these curves, Eq. (4b) was rewritten in the lumped-parameter form $\eta = \eta_o/(1 - T_b/T_c)$, where $\eta_o \equiv fL/\pi^{\frac{1}{2}}CT_c$. If $T_b$ and $T_c$ are expressed in °C., room temperature is much less than $T_c$, so that $\eta_o \approx \eta$ at room temperature, and $\Delta Y_o$ corresponds to $\eta_o$. Curves of $\Delta Y/\Delta Y_o$ vs $T_b/T_c = 1 - \eta_o/\eta$ were calculated by adopting pairs of numerical values of $\eta_o$ and $T_c$, then compared with the experimental points (for each point, the adopted value of $T_c$ was used to determine $T_b/T_c$). A reasonable overall fit has been obtained, as shown in FIG. 9, for $\eta_o=0.14$ and $T_c=685°$ C. The abrupt increase in $\Delta Y/\Delta Y_o$ when $T_b/T_c$ exceeds about 0.7 is associated with the approach of $T_b$ to the value $T_r$ above which laser irradiation results in boundary runaway. From the calculations, $T_r$ is about 0.775 $T_c=530°$ C.

From the definition of $\eta_o$, $fL=\pi^{\frac{1}{2}}CT_c\eta_o$. Taking $C=0.08$ cal/g°C. for amorphous Ge and the values of $T_c$ and $\eta_o$ used for FIG. 9, $fL=13.6$ cal/g. In calorimetric measurements made during the rapid heating of amorphous Ge films, Chen and Turnbull observed a sharp transistion at ~500° C. and measured $L=37.1$ cal/g. See H. S. Chen and D. Turnbull, *J. Appl. Phys.*, 40, 4214 (1969). Using the model result for fL gave a value of only about ⅓ for f.

The Gaussian width of the laser temperature profile can be determined from the relationship $a=\Delta Y/V\Delta \tau$. From the measured $\Delta Y_o=50$ μm at room temperature and $V\Delta \tau \equiv 0.25$ correspondong to $\eta_o$ in the inset of FIG. 9, $a \sim 200$ μm. The phase boundary velocity $v_{ac}$ can then be determined from the normalized boundary velocity $V_{ac} \sim 1.9$ by using the relation $v_{ac}=4\kappa V_{ac}/a$. For $\kappa=K\rho C$, a value of 0.09 cm$^2$/sec is estimated by taking $K=0.035$ cal/cm sec°C., $\rho \approx 5$ g/cm$^3$, and $C=0.08$ cal/g°C. The valued obtained for $V_{ac}$ is then ~ 35 cm/sec, much higher than the laser scan velocity $v=0.5$ cm/sec.

The value obtained for the front velocity, $V_{ac}$, is dependent upon the time interval $\delta \tau$ for numerical integration, and represents a lower limit, since smaller values of St lead to higher values of $V_{ac}$. The values obtained from the calculation for the spatial period of the oscillations are, however, independent of $\delta \tau$. Results of preliminary measurements of $V_{ac}$ for a 0.3 μm film of amorphous germanium indicate that the value for $V_{ac}$ is between 150 and 400 cm/sec. The exact $V_{ac}$ value will depend upon such variables as film thickness, the particular semiconductor, and the substrate material and temperature. In all cases, the front velocity, $V_{ac}$, is much higher than the scan velocity.

Figure 10:
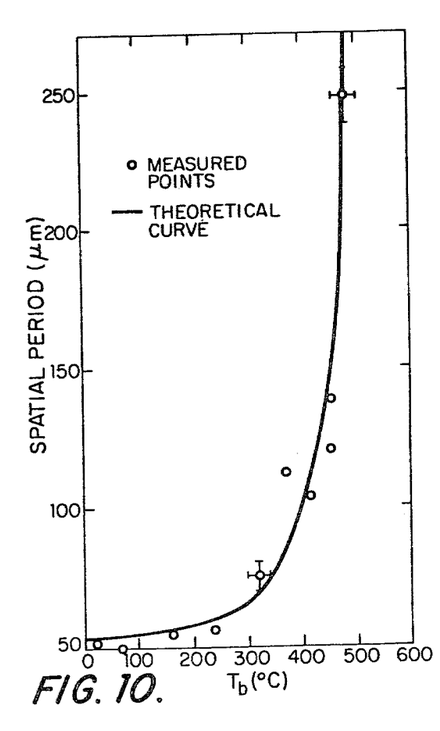
FIG. 10 is a plot of theoretical and experimental data for the spatial period structural features of laser-crystallized germanium films as a function of background temperature.

FIG. 10 presents the experimental and theoretical data obtained in a slightly different manner. The points shown are the experimental data whereas the computer solution of Eq. 3 is plotted as a continuous curve. From these data, it can be appreciated that larger, aligned crystallites are produced by longer spatial periods.

From the above, it can be seen that the scan rate of the laser beam or other energy beam, can be used itself or in conjunction with the background temperature to achieve continuous, controlled motion of the crystallization front. The scan rate can be much more rapid than has traditionally been employed which is possible because of the solid phase nature of the amorphous—crystalline transformation. Of course, the scan rate of the laser beam or other energy beam need not be continuous, but may itself be pulsed in a manner which applies a pulse of energy to the crystallization front prior to the time that the front would quench to a temperature which would result in periodic structure.

Figure 11:
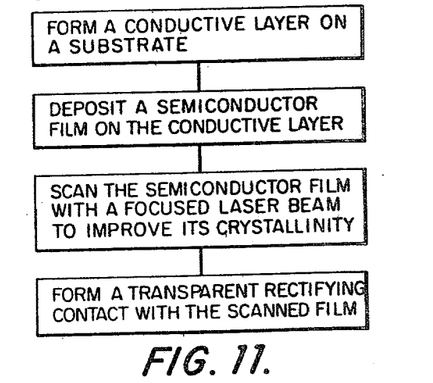
FIG. 11 is a block diagram which illustrates one method for fabricating a photovoltaic cell employing laser beam scanning of a semiconductor film as described herein.
Figure 12:
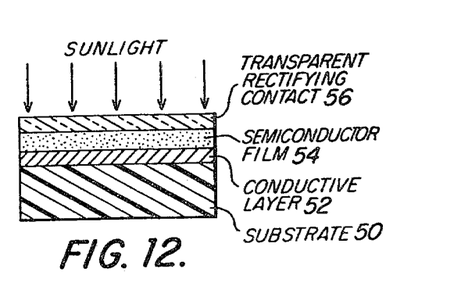
FIG. 12 is a cross-sectional view of a photovoltaic cell which could be prepared by the method illustrated in FIG. 11.

FIG. 11 illustrates diagrammatically the fabrication of a photovoltaic cell employing the laser scanning procedure described herein, and FIG. 12 illustrates a cell produced thereby. The first step in this fabrication is the formation of a conductive layer 52 on a substrate 50. This could be acheived, for example, by vacuum depositing a metal layer such as copper, silver, tin, gold or other metal onto substrate 50. Substrate 50 need not be transparent, but certainly could be. Also, substrate 50 itself could be conducting, which satisfies the first step in this fabrication.

Then, a film of amorphous semiconductor 54 is deposited onto conducting layer 52 or directly onto substrate 50 if it is conducting. An example is a depositon of a thin film of silicon during the final step in the preparation of pure silicon by a method such as the chlorosilane process. Thus, the cost of the amorphous silicon film could be covered in the silicon purification step. Any suitable semiconductor deposition process which provided the purity required could be used, of course, since the usual crystalline perfection requirements are not present because the semiconductor film will undergo laser beam or other energy beam scanning.

Amorphous semiconductor film 54 is then scanned with a focused laser beam from a high power laser to improve its crystalline properties. This might be acheived, for example, in the case of an amorphous silicon film by the mechanical linear sweep of the silicon sheet under a slit image from a Nd:YAG laser and/or with the slit image scanned laterally back and forth by an acousto-optic or electro-optic scanner.

Finally, a transparent rectifying contact 56 is formed with a laser-scanned semiconductor film 54. This could be done, for example, by depositing a transparent, highly conducting tin-doped indium oxide film over a thin transparent metallic layer to form a Schottky barrier. Suitable tin-doped indium oxide films are described in Fan, J.C.C., and Bachner, F.J., *J. Electro Chem. Soc.*, 122, 1719 (1975), the teachings of which are hereby incorporated by reference. Alternatively, a rectifying contact would be formed by laser scanning in a doping atmosphere to form a p-n junction at the surface of the laser-scanned film.

As illustrated in FIG. 12, sunlight enters the photovoltaic cell through the transparent, rectifying contact 56 and passes to the laser scanned semiconductor film 54 where a photovoltaic current is generated.

Figure 13:
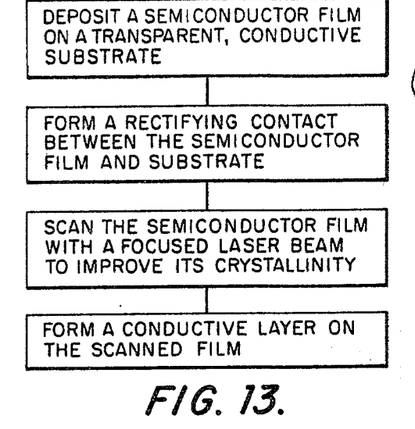
FIG. 13 is a block diagram which illustrates an alternative method for fabricating a photovoltaic cell employing laser beam scanning of the semiconductor film as described herein.
Figure 14:
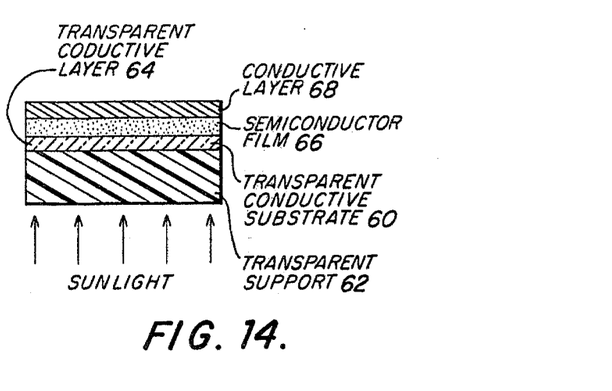
FIG. 14 is a cross-sectional view of a photovoltaic cell which could be prepared by the method illustrated in FIG. 13.

FIG. 13 illustrates diagrammatically an alternative procedure for fabricating a photovoltaic cell employing the laser scanning procedures described herein, and FIG. 14 illustrates the cell itself. In this fabrication procedure, a transparent, conductive substrate 60 is used which can be formed by depositing on transparent support 62 a conductive layer 64. Transparent support 62 can be glass or transparent plastic and conductive layer 64 can be a thin layer of a conductive metal. Prefereably, a conductive layer 64 is a material which will also form a recitfying contact with a semiconductor layer subsequently deposited thereon. A layer of tin-doped indium oxide, as previously mentioned, would serve as a conductor and would also form a Schottky barrier with some semiconductors such as silicon. Alternatively, another layer which is capable of forming a rectifying contact with the semiconductor could be deposited on to conductive layer 64. Of course, one material which is transparent, conductive and capable of forming a rectifying contact with the semiconductor layer could also be used. Also, the rectifying contact required can be formed upon deposition of the semiconductor film, or alternatively, in a post treatment of the film. In fact, one suitable post treatment is the laser scanning of the semiconductor film.

A semiconductor film 66, such as a thin film of amorphous silicon, is then deposited on top of transparent, conductive substrate 60. As noted previously, many of the known processes for depositing semiconductor films can be used since the usual limitations on crystal perfection are obviated with subsequent laser scanning of the film.

The semiconductor film 66 is then scanned with a focused laser beam from a high power laser to improve the film's crystalline properties. Lastly, a conductive layer 68, such as aluminum or other metal, is formed on top of laser-scanned semiconductor film 66. As can be seen in FIG. 14, sunlight enters this photovoltaic cell through the transparent, conductive substrate 60.

Figure 15:
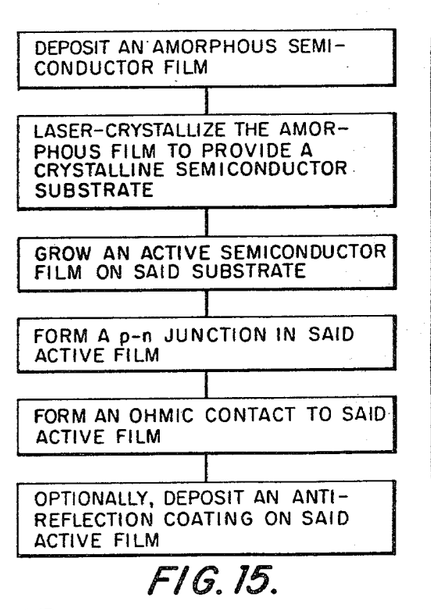
FIG. 15 is a block diagram which illustrates still another alternative method for fabricating a photovoltaic cell employing laser beam scanning of a semiconductor film as described herein.
Figure 16:
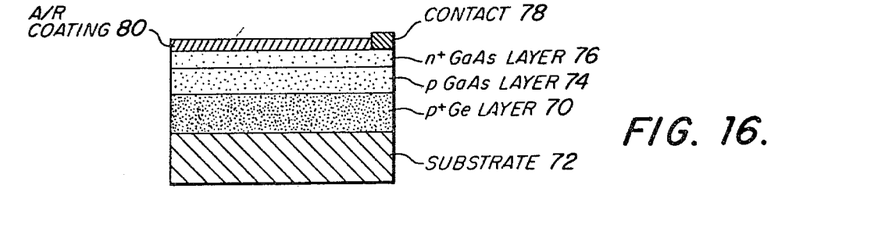
FIG. 16 is a block diagram of a photovoltaic cell prepared by the method illustrated in FIG. 15.

FIG. 15 illustrates diagrammatically still another alternative procedure for fabricating a photovoltaic cell employing the laser scanning procedures described herein, and FIG. 16 illustrates the cell produced thereby. In this procedure, an amorphous semiconductor layer 70 is deposited on a substrate 72 which could be a metal or heavily-doped semiconductor. This deposited layer 70 might comprise, for example, a p+ germanium layer having a thickness between 0.1 and 500 $\mu$m and being formed from amorphous germanium doped with p-dopants to a carrier level of about $10^{18}$ carriers/cm$^3$ or greater. The amorphous germanium layer 70 is then scanned with a high power laser beam as described herein to provide a crystalline semiconductor layer 70. Subsequently, a gallium arsenide layer 74 is applied to the germanium substrate by chemical vapor deposition or other deposition technique. The p layer of gallium arsenide 74 can then be diffused with n-type dopant to form a shallow homojunction therein, or a separate n+ GaAs layer 76 can be deposited. An ohmic contact 78 is then attached, and an anti-reflection coating 80 can be deposited upon the light receiving surface of the cell. Shallow homojunction devices of this type are described in detail in copending application Ser. No. 22,405, filed March 21, 1979, and the teachings of this application are hereby incorporated by reference.

Although much of the actual experimental work described herein was performed employing amorphous germanium films, similar effects were observed in gallium arsenide and silicon films. It is also believed that other semiconductors could be crystallized by the method of this invention, including, but not limited to, indium phosphide, cadmium sulfide, cadmium telluride, gallium phosphide, germanium/silicon alloy, etc. Moreover, the invention described herein can also be employed in the crystallization of amorphous materials which are not semiconductor materials. These include: inorganic oxides or nitrides such as aluminum oxide or silicon dioxide; amorphous carbon; and even amorphous metals.

It should also be recognized that the invention is suitable with materials which are not 100 percent amorphous, including mixtures of amorphous and crystalline materials. In certain cases, the latent heat liberated upon crystallization might even cause further reaction of materials.

Similarly, although the work described above was performed with laser beams from a Nd:YAG laser, other lasers could be employed, as well as other energy beams. Examples of other suitable energy beams include ion beams, electron beams, or trains of electrical pulses which simulate moving energy beams.

Often, it is desirable to heat the substrate to an elevated temperature, but this must always be below $T_c$. The energy beam then supplies sufficient energy to heat the amorphous material above $T_c$. In addition, one possible method is to scan the energy beam at a velocity as fast as the crystallization front velocity $V_{ac}$ in order to maintain the control of the front propagation.

Figure 17:
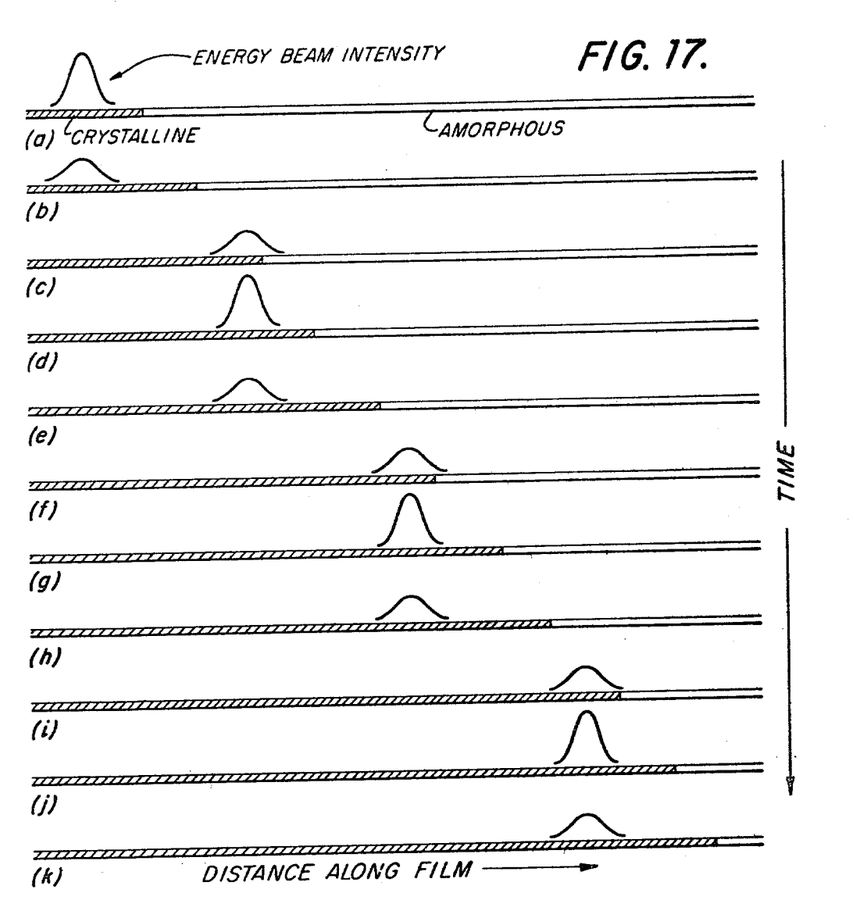
FIG. 17 is a schematic diagram illustrating crystallization according to this invention with a spatially and temporarily modulated energy beam.

In certain cases, it would be advantageous to modulate the rapidly scanning beam to maintain even better control of the front propagation. In some of these cases; it is preferable to employ a spatially and temporally modulated beam, as is schematically illustrated in FIG. 17. As illustrated in FIG. 17(a), the energy beam initially has a high intensity causing initiation of crystallization and advancement of the crystallization front to a position in front of the beam. At a later time, the beam intensity is lowered but the crystallization front advances further ahead of the beam, as in FIG. 17(b). At a still later time and before the film quenches to cause periodic structure, the beam is advanced and almost catches the crystallization front, as shown in FIG. 17(c). In FIG. 17(d), the laser intensity is increased and the crystallization front again moves away from the beam. In FIG. 17(e), the laser intensity is decreased, but before quenching can occur, the beam is moved towards the front, as in FIG. 17(f). Such spatial and temporal modulation is continued, as shown in FIG. 17(g)–FIG. 17(k), until the desired crystallization has been completed. In this manner, the quenching of the film to a temperature below $T_c$ is avoided at one extreme whereas runaway crystallization is avoided at the other extreme.

Figure 18:
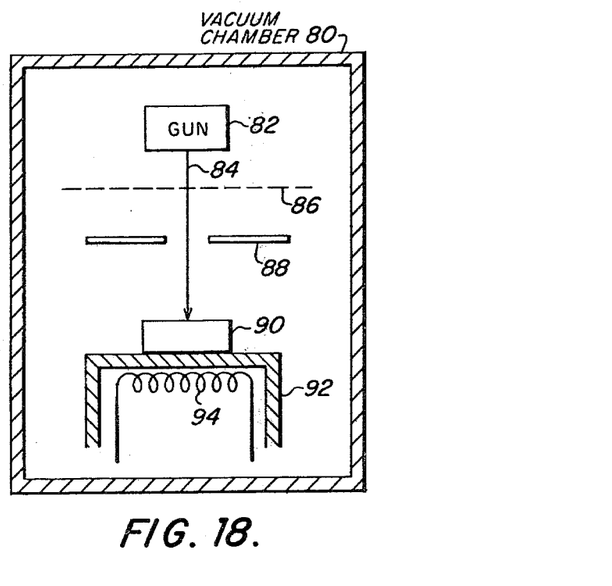
FIG. 18 is a schematic diagram of an apparatus suitable for crystallizing amorphous materials according to this invention by employing an electron beam or an ion beam; and, FIG. 19 is a schematic diagram of an apparatus for crystallizing amorphous materials according to this invention employing a train of electrical pulses simulating a moving energy beam.

FIG. 18 illustrates an apparatus suitable for crystallizing amorphous materials by an electron or ion beam. This apparatus is contained within a vacuum chamber 80. Gun 82 can be an electron or ion beam gun, which produces energy beam 84. Beam 84 is focused by focusing means 86 and caused to scan by scanning means 88. Sample 90 is the amorphous material to be crystallized and is supported on sample holder 92 which has resistance heater 94 therein to heat sample 90. In the case where gun 82 is an ion beam gum, simultaneous doping of a semiconductor is possible.

Figure 19:
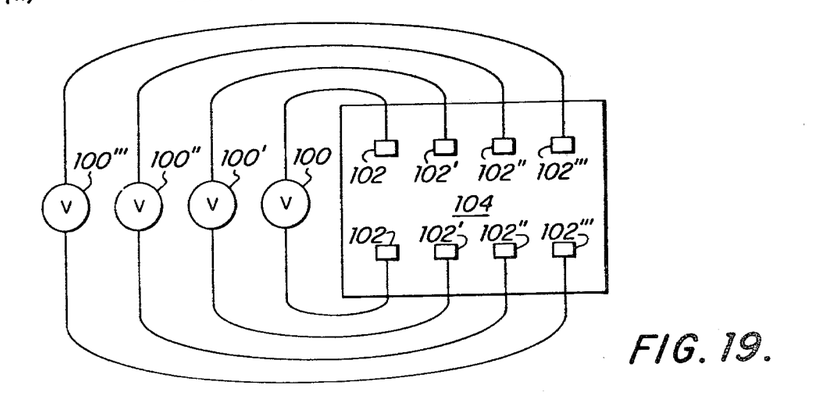

FIG. 19 illustrates still another embodiment of apparatus suitable for carrying out the invention. In this apparatus, a series of voltage sources 100, 100′, 100″, 100‴ are employed to consecutively apply electrical pulses to conducting pad sets 102, 102′, 102″, 102‴. This simulates a moving beam of energy thereby causing a crystallization front to move along amorphous material 104, if the appropriate conditions are chosen.

Industrial Applicability

The invention described herein has industrial applicability in the conversion of amorphous materials, such as semiconductor films, to crystalline materials. As described above, such crystalline semiconductor films are employed in photovoltaic devices. It also has industrial applicability in the very rapid conversion of amorphous materials other than semiconductor materials to a crystalline state.

Equivalents

There are many equivalents to the embodiments specifically described herein and such equivalents are intended to be covered by the following claims. For example, although amorphous films or amorphous layers are referred to in many instances, films and layers are meant to be interchangeable.

We claim:

1. A method of converting solid amorphous material to a more crystalline state comprising the steps of:

(a) heating a portion of said material with energy from an energy beam to bring such portion to its crystallization temperature while maintaining the temperature below the melting temperature of the crystalline state of the material; and
(b) moving said energy beam in relation to said material at a velocity V, which is less than or equal to $V_{ac}$ but fast enough to provide continuous controlled motion of the crystallization front; wherein $V_{ac}$ is the normalized boundary velocity of the transformation of the amorphous material to crystalline.

2. The method of claim 1 wherein said material comprises a semiconductor film.

3. The method of claim 2 wherein said energy beam is a laser beam, electron beam, ion beam, train of electrical pulses, or a combination thereof.

4. The method of claim 3 wherein said beam is shaped to a focused image having a large aspect ratio.

5. The method of claim 2 wherein said energy beam comprises a focused, shaped laser beam.

6. The method of claim 5 wherein said laser beam has an aspect ratio of greater than about 10.

7. The method of claim 6 wherein said semiconductor film comprises a germanium film and the laser beam employed originates from a continuous wave Nd:YAG laser.

8. The method of claim 5 wherein said laser beam is modulated spatially and temporally.

9. The method of claim 8 wherein said laser beam is focused to a slit image.

10. The method of claim 2 wherein said film is preheated with a source of heat other than said laser beam.

11. The method of claim 10 wherein said semiconductor film is supported on a substrate.

12. In the method of crystallizing an amorphous material by scanning it with an energy beam:
providing continuous controlled motion of the crystallization front by (a) maintaining the background temperature of the amorphous material at a value which is between the temperature at which periodic structure occurs and the temperature which produces runaway crystallization and (b) modulating the beam and scanning a surface of the material with the beam at a rate less than or equal to the normalized boundary velocity of the crystallization front.

13. The improvement of claim 12 wherein said energy beam is a laser beam.

14. A method for producing a crystalline semiconductor film, comprising:
a. forming an amorphous film of a semiconductor on a substrate; and,
b. scanning said amorphous film to crystallize it with a laser beam, said laser beam being modulated to provide continuous, controlled motion of the crystallization front, the scanning rate being less than or equal to the velocity of the crystallization front and the modulation of the laser beam being at an energy level to crystallize the material without achieving a temperature equal to or greater than the crystalline melting point of the material.

15. A method of claim 14 wherein said laser is a Nd:YAG laser.

16. A method of claim 15 wherein said amorphous film comprises an amorphous silicon film.

17. A method of claim 15 wherein said amorphous film comprises an amorphous germanium film.

18. A method of claim 15 wherein said amorphous film comprises an amorphous germanium/silicon alloy film.

19. A method of claim 15 wherein said amorphous film comprises an amorphous gallium arsenide film.

20. A method of crystallizing an amorphous inorganic material in the solid phase comprising scanning said material with an energy beam sufficient to provide continuous, controlled motion of the crystallization front velocity but insufficient energy to reach the melting point of the crystalline material; the scanning rate being less than or equal to the crystallization front velocity.

21. A method of claim 20 wherein said inorganic material comprises aluminum oxide.

22. A method of claim 20 wherein said inorganic material comprises silicon dioxide.

23. A method of fabricating a photovoltaic cell, comprising:
a. forming a conductive layer on a substrate;
b. forming an amorphous semiconductor film on said conductive layer;
c. scanning said amorphous semiconductor film with an energy beam at a rate which is less than or equal to the crystallization wavefront velocity and at an energy level high enough to provide continuous, controlled motion of the crystallization front to improve the crystallinity of said semiconductor film but below the melting temperature of the crystalline state of the film; and,
d. forming a transparent rectifying contact with the scanned film.

24. A method of claim 23 wherein said beam comprises a laser beam.

25. A method of fabricated a photovoltaic cell, comprising:
a. forming an amorphous semiconductor film on a transparent, conductive substrate;
b. forming a rectifying contact between the amorphous semiconductor film and substrate;
c. scanning said amorphous semiconductor film with an energy beam at a rate which is less than or equal to the crystallization wavefront velocity but at an energy level low enough to prevent reaching the crystalline melting point of the film to provide continuous, controlled motion of the crystallization front to improve the crystallinity of said semiconductor film; and,
d. forming a conductive layer on the scanned film.

26. A method of claim 25 wherein said beam comprises a laser beam.

27. A method of fabricating a photovoltaic cell, comprising:
a. depositing an amorphous semiconductor layer;
b. scanning said amorphous semiconductor layer with an energy beam at a rate which is less than or equal to the crystallization wavefront velocity and at an energy level low enough to avoid the crystalline melting point of the layer thereby to provide a continuous, controlled motion of a crystallization front to form a crystalline semiconductor substrate;
c. forming an active semiconductor film on said substrate;
d. forming a p-n junction in said active film; and,
e. forming an ohmic contact to said active semiconductor film.

28. A method of claim 27 wherein said amorphous semiconductor layer comprises germanium.

29. A method of claim 28 wherein said active semiconductor layer comprises gallium arsenide.

30. A method of claim 29 wherein said p-n junction comprises a shallow homojunction.

31. A method of claim 30 including the additional step of applying an antireflection coating over said active semiconductor layer.

32. In the fabrication of a shallow homojunction solar cell from a semiconductor layer:

The improvement wherein said layer is formed from an amorphous semiconductor layer scanned with an energy beam at a rate which is less than or equal to the crystallization wavefront velocity and at an energy level low enough to prevent the temperature of the layer to reach its crystalline melting point thereby to provide continuous, controlled motion of the crystallization front to form a crystalline semiconductor layer for said shallow homojunction solar cell.

33. The improvement of claim 32 wherein said amorphous substrate comprises germanium.

34. In the method of crystallizing an amorphous material with a moving energy beam:

The improvement of modulating said energy beam in conjunction with heating said material to an elevated temperature at a rate which is less than or equal to the crystallization wavefront velocity and at an energy level low enough to prevent liquifying or vaporizing the material thereby to provide a controlled, continuous crystallization front.

* * * * *